(12) United States Patent
Tu

(10) Patent No.: US 6,812,093 B2
(45) Date of Patent: Nov. 2, 2004

(54) METHOD FOR FABRICATING MEMORY CELL STRUCTURE EMPLOYING CONTIGUOUS GATE AND CAPACITOR DIELECTRIC LAYER

(75) Inventor: Kuo-Chi Tu, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/401,429

(22) Filed: Mar. 28, 2003

(65) Prior Publication Data

US 2004/0191985 A1 Sep. 30, 2004

(51) Int. Cl.$^7$ ........................................ H01L 21/8242
(52) U.S. Cl. ...................................................... 438/244
(58) Field of Search ................................ 438/244, 243, 438/246, 253, 396

(56) References Cited

U.S. PATENT DOCUMENTS 6,087,214 A * 7/2000 Cunningham ................ 438/244
6,362,041 B1    3/2002  Wang et al.
6,468,855 B2    10/2002 Leung et al.
6,661,049 B2 * 12/2003 Tzeng et al. ................. 257/296

* cited by examiner

Primary Examiner—David Nelms
Assistant Examiner—Quoc Hoang
(74) Attorney, Agent, or Firm—Tung & Associates

(57) ABSTRACT

A method for fabricating a memory cell structure provides for fabricating a capacitor within the memory cell structure within an asymmetric trench within an isolation region adjoining an active region such that a capacitor node layer within the capacitor contacts a sidewall of the active region and is electrically connected to a source/drain region within a field effect transistor device fabricated within the active region. The method also employs when fabricating the memory cell structure a contiguous dielectric layer as a gate dielectric layer within the field effect transistor device and a capacitor dielectric layer within the capacitor. The dynamic random access memory cell structure may be efficiently fabricated as an embedded dynamic random access memory cell structure.

20 Claims, 1 Drawing Sheet

METHOD FOR FABRICATING MEMORY CELL STRUCTURE EMPLOYING CONTIGUOUS GATE AND CAPACITOR DIELECTRIC LAYER

BACKGROUND OF THE INVENTION

1. Field of the Invention

The present invention relates generally to memory cell structures employed within semiconductor products. More particularly, the present invention relates to methods for efficiently fabricating memory cell structures employed within semiconductor products.

2. Description of the Related Art

Common in the semiconductor product fabrication art is the use of memory cell structures, such as dynamic random access memory (DRAM) cell structures, for data storage within semiconductor products. Memory cell structures typically comprise a field effect transistor device as a switching element. One of the source/drain regions within the field effect transistor device typically has electrically connected thereto a capacitor which serves a data storage function. The other of the source/drain regions serves as a connection for a bitline which introduces or extracts charge with respect to the storage capacitor incident to electrical actuation of a wordline which is connected to a gate electrode of the field effect transistor device.

While memory cell structures in general, and dynamic random access memory cell structures in particular, are common in the semiconductor product fabrication art, dynamic random access memory cell structures in particular are not entirely without problems.

In that regard, it is often difficult to fabricate memory cell structures within semiconductor products with enhanced efficiency and enhanced performance.

It is thus towards the foregoing object that the present invention is directed.

Various memory cell structures having desirable properties, and methods for fabrication thereof, have been disclosed in the semiconductor product fabrication art.

Included but not limiting among the memory cell structures and methods for fabrication thereof are those disclosed within: (1) Wang et al., in U.S. Pat. No. 6,362,041 (a method for forming a dynamic random access memory cell structure which employs a contiguous dielectric layer when forming both a gate dielectric layer and a capacitor dielectric layer); and (2) Leung et al., in U.S. Pat. No. 6,468,855 (a reduced topography dynamic random access memory cell structure and method for fabrication thereof).

The teachings of each of the foregoing references is incorporated herein fully by reference.

Desirable in the semiconductor product fabrication art are additional memory cell structures and methods for fabrication thereof, with enhanced efficiency and enhanced performance.

It is towards the foregoing object that the present invention is directed.

SUMMARY OF THE INVENTION

A first object of the present invention is to provide a memory cell structure and a method for fabricating the memory cell structure.

A second object of the invention is to provide a memory cell structure and method for fabrication thereof in accord with the first object of the invention, wherein the memory cell structure is fabricated with enhanced efficiency and enhanced performance.

In accord with the objects of the invention, the invention provides a method for fabricating a memory cell structure.

The method first provides a semiconductor substrate having formed therein an isolation trench adjoining an active region of the semiconductor substrate, where the isolation trench in turn has formed, therein an isolation region. The method also provides for forming within the isolation region an asymmetric trench which exposes a sidewall of the active region. The method further provides for forming into the asymmetric trench a capacitor node layer which contacts the sidewall of the active region. The method next provides for forming upon the active region and the capacitor node layer a contiguous dielectric layer which serves as a gate dielectric layer and a capacitor dielectric layer. The method next provides for forming upon the contiguous dielectric layer a contiguous conductor layer which serves as a gate electrode and a capacitor plate layer. The method next provides for patterning the single conductor layer to form: (1) a gate electrode over the active region of the semiconductor substrate; and (2) a separate capacitor plate layer over the capacitor node layer. Finally, the method provides for forming into the active region a source/drain region electrically connected to the capacitor node layer.

The present invention provides a memory cell structure and a method for fabricating the memory cell structure, wherein the memory cell structure is fabricated with enhanced efficiency and enhanced performance.

The present invention realizes the foregoing object by: (1) fabricating a capacitor within a memory cell structure within an asymmetric trench within an isolation region adjoining an active region of a semiconductor substrate such that a capacitor node layer within the capacitor contacts a sidewall of the active region and is electrically connected with a source/drain region within a field effect transistor device fabricated within the active region of the semiconductor substrate; and (2) employing when fabricating the memory cell structure a contiguous dielectric layer as a gate dielectric layer within the field effect transistor device and a capacitor dielectric layer within the capacitor.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a memory cell structure and a method for fabricating the memory cell structure, wherein the memory cell structure is fabricated with enhanced efficiency and enhanced performance.

The present invention realizes the foregoing object by: (1) fabricating a capacitor within a memory cell structure within an asymmetric trench within an isolation region such that a capacitor node within the capacitor contacts a sidewall of the active region and is electrically connected to a source/drain region within a field effect transistor device fabricated within the active region of the semiconductor substrate; and (2) employing when fabricating the memory cell structure a contiguous dielectric layer as a gate dielectric layer within the field effect transistor device and a capacitor dielectric layer within the capacitor.

Figure 1:
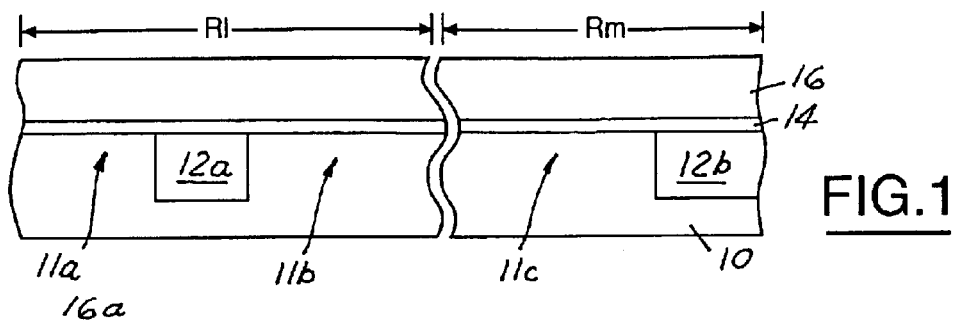
FIG. 1, FIG. 2, FIG. 3, FIG. 4, FIG. 5 and FIG. 6 show a series of schematic cross-sectional diagrams illustrating the results of progressive stages of fabricating a memory cell structure in accord with a preferred embodiment of the invention.

FIG. 1 to FIG. 6 show a series of schematic cross-sectional diagrams illustrating the results of progressive stages of fabricating a memory cell structure in accord with a preferred embodiment of the invention. FIG. 1 shows a schematic cross-sectional diagram of the memory cell structure at an early stage in its fabrication in accord with the preferred embodiment of the invention.

FIG. 1 shows a semiconductor substrate 10 having formed therein a pair of isolation regions 12a and 12b which define in part a series of active regions 11a, 11b and 11c of the semiconductor substrate 10. Within FIG. 1 the pair of active regions 11a and 11b is located within a logic device region R1 of the semiconductor substrate 10 while the active region 11c is located within a memory device region Rm of the semiconductor substrate 10. Thus, FIG. 1 is intended to illustrate an embedded memory cell structure. Also shown within FIG. 1 is a blanket, etch stop layer 14 formed upon the isolation regions 12a and 12b and the active regions 11a, 11b and 11c of the semiconductor substrate, as well as a blanket capacitor node dielectric layer 16 formed upon the blanket etch stop layer 14.

Within the invention, the semiconductor substrate 10 may be of either dopant polarity, several dopant concentrations and various crystallographic orientations as are otherwise generally conventional in the semiconductor product fabrication art. In addition, the semiconductor substrate 10 will typically have formed therein various doped well regions as are otherwise also generally conventional in the semiconductor product fabrication art and as are illustrated in greater detail within the related art references cited within the Description of the Related Art. Typically, the portion of the semiconductor substrate 10 within the memory device region Rm will comprise a P well region, while the portion of the semiconductor substrate 10 within the logic device region R1 will comprise both P and N well regions.

Within the invention, each of the isolation regions 12a and 12b is formed within a corresponding isolation trench within the semiconductor substrate 10. Typically, each of the isolation trenches is formed to a depth of from about 4000 to about 8000 angstroms within the semiconductor substrate 10. Typically, each of the isolation regions 12a and 12b is formed at least in part of a silicon oxide dielectric material.

Within the invention, the blanket etch stop layer 14 is formed of an etch stop material which serves as an etch stop when etching the blanket capacitor node dielectric layer 16 in accord with further processing of the memory cell structure of FIG. 1. Although other materials may also be employed for forming the blanket etch stop layer 14, the blanket etch stop layer 14 is typically formed of a silicon nitride material or a silicon oxynitride material, and formed to a thickness of from about 200 to about 500 angstroms.

Within the invention, blanket capacitor node dielectric layer 16 is typically formed of a silicon oxide material when the blanket etch stop layer 14 is formed of a silicon nitride material or a silicon oxynitride material. Typically, the blanket capacitor node dielectric layer 16 is formed to a thickness of from about 4000 to about 8000 angstroms.

Figure 2:
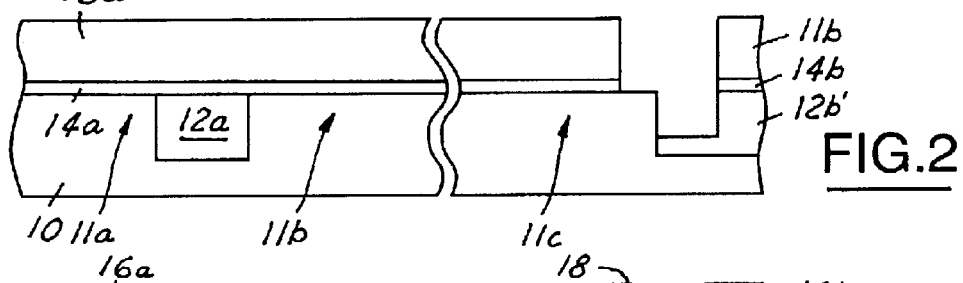

FIG. 2 shows the results of further processing of the memory cell structure of FIG. 1.

FIG. 2 illustrates the results of successively etching the blanket capacitor node dielectric layer 16, the blanket etch stop layer 14 and the isolation region 12b to form: (1) a pair of patterned capacitor node dielectric layers 16a and 16b; (2) a pair of patterned etch stop layers 14a and 14b; and (3) an etched isolation region 12b'. Within the invention, the isolation region 12b is etched such as to form an asymmetric trench within the etched isolation region 12b', where the asymmetric trench exposes a sidewall of the active region of the semiconductor substrate 10 adjoining thereto. Remainder portions of the asymmetric trench are defined by the etched isolation region 12b'. Typically, the asymmetric trench etched within the etched isolation region 12b' is etched to a depth of from about 2000 to about 6000 angstroms. The pair of patterned capacitor node dielectric layers 16a and 16b and the pair of patterned etch stop layers 14a and 14b define in part an aperture which is contiguous with and contains the asymmetric trench within the etched isolation region 12b'.

Figure 3:
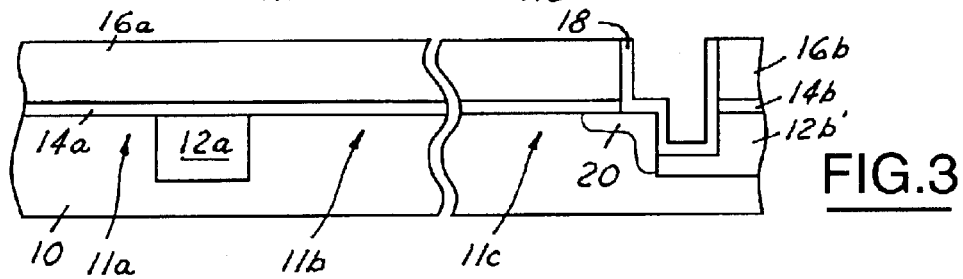

FIG. 3 illustrates the results of further processing of the memory cell structure of FIG. 2.

FIG. 3 illustrates a capacitor node layer 18 formed into the aperture defined by the pair of patterned capacitor node dielectric layers 16a and 16b, the pair of patterned etch stop layers 14a and 14b and the asymmetric trench within the etched isolation region 12b', while contacting the sidewall of the active region 11a of the semiconductor substrate 10.

Within the invention, the capacitor node layer 18 is typically formed of a doped polysilicon material initially formed as a conformal layer upon exposed portions of the patterned capacitor node dielectric layers 16a and 16b, the pair of patterned etch stop layers 14a and 14b, the semiconductor substrate 10 and the etched isolation region 12b'. The conformal layer is subsequently planarized, typically while employing a chemical mechanical polish planarizing method. Typically, the blanket conformal capacitor node layer is formed to a thickness of from about 500 to about 2000 angstroms.

Finally, FIG. 3 also shows a doped region 20 formed into the active region of the semiconductor substrate 10. The doped region is contacted with the capacitor node layer 18.

Within the invention, the doped region 20 may as a preferred option be formed independently via ion implantation either before or after forming the capacitor node layer 18 (i.e., ion implantation of the sidewall of the active region). Alternatively, the doped region 20 may be formed incident to thermal out-diffusion of a dopant within the capacitor node layer 18. Typically, the doped region 20 has a dopant concentration of from about 1E20 to about 1E24 dopant atoms per cubic centimeter and is of dopant polarity opposite the active region 11c of the semiconductor substrate within which it is formed.

Figure 4:
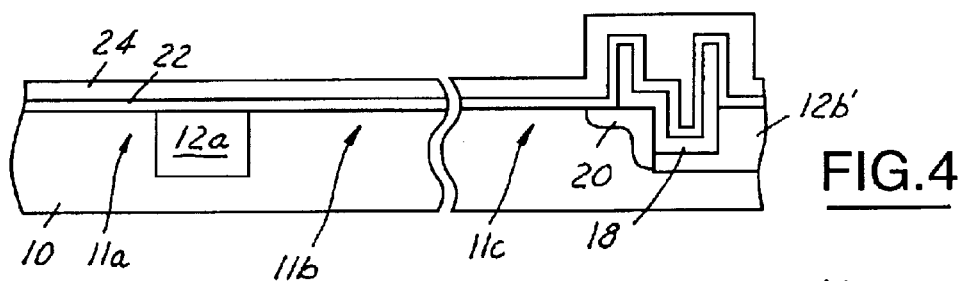

FIG. 4 illustrates the results of further processing of the memory cell structure of FIG. 3.

FIG. 4 shows, in a first instance, the results of stripping the pair of patterned capacitor node dielectric layers 16a and 16b and the pair of patterned etch stop layers 14a and 14b from the memory cell structure of FIG. 3.

Within the invention, the pair of patterned capacitor node dielectric layers 16a and 16b when formed of a silicon oxide material may be stripped employing an aqueous hydrofluoric acid containing etchant, while the pair of patterned etch stop layers 14a and 14b when formed of a silicon nitride material may be stripped while employing an aqueous phosphoric acid etchant.

After having stripped from the dynamic random access memory cell structure of FIG. 3 the pair of patterned capacitor node dielectric layers 16a and 16b and the pair of patterned etch stop layers 14a and 14b, FIG. 4 further illustrates the results of forming upon the active regions 11a, 11b, 11c of the semiconductor substrate 10, the isolation region 12a, the etched isolation region 12b, and the capacitor node layer 18 a blanket gate and capacitor dielectric layer 22. Finally, FIG. 4 shows a blanket gate electrode and capacitor plate layer 24 formed upon the blanket gate and capacitor dielectric layer 22.

Within the invention, the blanket gate and capacitor dielectric layer 22 is with respect to at least the memory device region Rm of the semiconductor substrate 10 a contiguous (preferably single) layer blanket gate and capacitor dielectric layer 22 which may be formed incident to thermal oxidation of the active regions 11a, 11b and 11c of the semiconductor substrate 10 and the capacitor node layer 18. Alternatively, the blanket gate and capacitor dielectric layer 22 may be independently deposited. Typically, the blanket gate and capacitor dielectric layer 22 is formed of a silicon oxide dielectric material incident to thermal oxidation of the active regions 11a, 11b and 11c of the semiconductor substrate 10 and the capacitor node layer 18 to form the blanket gate and capacitor dielectric layer 22 to a thickness of from about 50 to about 200 angstroms.

Within the invention, the blanket gate electrode and capacitor plate layer 24 is typically formed of a doped polysilicon material, formed to a thickness of from about 1500 to about 3500 angstroms.

Figure 5:
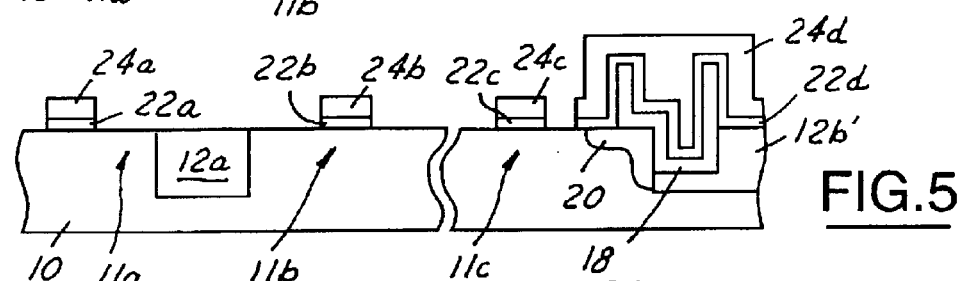

FIG. 5 illustrates the results of further processing of the memory cell structure of FIG. 4.

FIG. 5 illustrates the results of patterning the blanket gate electrode and capacitor plate layer 24 to form a series of gate electrodes 24a, 24b and 24c upon a series of gate dielectric layers 22a, 22b and 22c upon the active regions 11a, 11b and 11c of the semiconductor substrate 10; and (2) a capacitor plate layer 24d upon a capacitor dielectric layer 22d upon the capacitor node layer 18.

Within the invention, the foregoing patterning of the blanket gate electrode and capacitor plate layer 24 and the blanket gate and capacitor dielectric layer 22 may be effected employing methods as are conventional in the semiconductor product, fabrication art.

Figure 6:
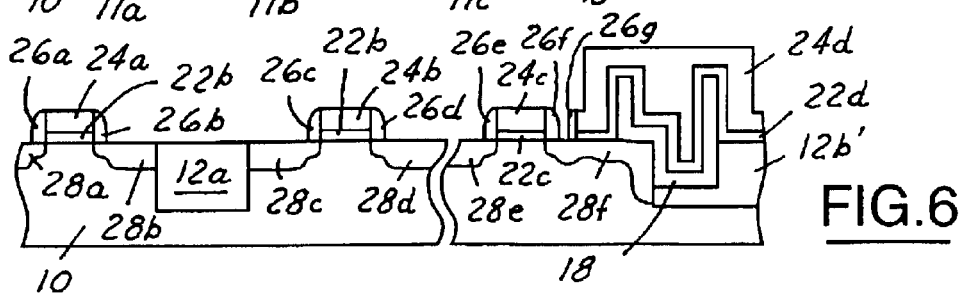

FIG. 6 illustrates the results of further processing of the dynamic random access memory cell structure of FIG. 5.

FIG. 6 illustrates the results of forming adjoining a pair of opposite sides of: (1) the gate electrode 24a and the gate dielectric layer 22a; (2) the gate electrode 24b and the gate dielectric layer 22b; (3) the gate electrode 24c and the gate dielectric layer 22c and (4) the capacitor plate layer 24d and the capacitor dielectric layer 22d, a series of spacer layers 26a, 26b, 26c, 26d, 26e, 26f and 26g.

The series of spacer layers 26a, 26b, 26c, 26d, 26e, 26f and 26g may be formed employing methods and materials as are otherwise generally conventional in the semiconductor product fabrication art.

FIG. 6 also shows a series of source/drain regions 28a, 28b, 28c, 28d, 28e and 28f formed into portions of the active regions 11a, 11b and 11c of the semiconductor substrate 10 at areas not covered by the spacer layers 26a, 26b, 26c, 26d, 26e, 26f and 26g, the gate electrodes 24a, 24b and 24c and the capacitor plate layer 24d. As is illustrated in FIG. 1, the source/drain region 28f encompasses the doped region 20, thus providing an electrical connection thereto with the capacitor node layer 18.

FIG. 6 illustrates a memory cell structure formed in accord with a preferred embodiment of the invention, wherein the memory cell structure is fabricated with enhanced efficiency and enhanced performance.

The present invention realizes the foregoing object by: (1) fabricating a capacitor within a memory cell structure within an asymmetric trench within an isolation region such that a capacitor node within the capacitor contacts a sidewall of an active region and is electrically connected to a source/drain region within a field effect transistor device fabricated within the active region; and (2) employing when fabricating the memory cell structure a contiguous dielectric layer as a gate dielectric layer within the field effect transistor device and a capacitor dielectric layer within the capacitor.

The preferred embodiment of the invention is illustrative of the invention rather than limiting of the invention. Revisions and modifications may be made to methods, materials, structures and dimensions in accord with the preferred embodiment of the invention, while still providing embodiments in accord with the invention, further in accord with the accompanying claims.

What is claimed is:

1. A method for forming a dynamic random access memory cell structure comprising:

providing a semiconductor substrate having formed therein an isolation trench adjoining an active region of the semiconductor substrate, the isolation trench having formed therein an isolation region;

forming within the isolation region an asymmetric trench which exposes a sidewall of the active region;

forming into the asymmetric trench a capacitor node layer which contacts the sidewall of the active region;

forming upon the active region and the capacitor node layer a contiguous dielectric layer which serves as a gate dielectric layer and a capacitor dielectric layer;

forming upon the contiguous dielectric layer a contiguous conductor layer which serves as a gate electrode and a capacitor plate layer;

patterning the contiguous conductor layer to form:
a gate electrode over the active region of the semiconductor substrate; and
a capacitor plate layer over the capacitor node layer; and forming into the active region a source/drain region electrically connected to the capacitor node layer.

2. The method of claim 1 wherein the isolation trench is formed to a depth of from about 4000 to about 8000 angstroms.

3. The method of claim 1 wherein the asymmetric trench is formed to a depth of from about 2000 to about 6000 angstroms.

4. The method of claim 1 wherein the capacitor node layer is formed to a thickness of from about 500 to about 2000 angstroms.

5. The method of claim 1 wherein the contiguous dielectric layer is formed to a thickness of from about 50 to about 200 angstroms.

6. The method of claim 1 wherein the contiguous conductor layer is formed to a thickness of from about 1500 to about 3500 angstroms.

7. The method of claim 1 further comprising ion implanting the sidewall of the active region within the asymmetric trench.

8. A method for forming a dynamic random access memory cell structure comprising:

providing a semiconductor substrate having formed therein an isolation trench adjoining an active region of the semiconductor substrate, the isolation trench having formed therein an isolation region;

forming within the isolation region an asymmetric trench which exposes a sidewall of the active region;

forming into the asymmetric trench a capacitor node layer which contacts the sidewall of the active region;

thermally oxidizing the active region and the capacitor node layer to form thereupon a contiguous dielectric layer which serves as a gate dielectric layer and a capacitor dielectric layer;

forming upon the contiguous dielectric layer a contiguous conductor layer which serves as a gate electrode and a capacitor plate layer;

patterning the contiguous conductor layer to form:
   a gate electrode over the active region of the semiconductor substrate; and
   a capacitor plate layer over the capacitor node layer; and forming into the active region a source/drain region electrically connected to the capacitor node layer.

9. The method of claim 8 wherein the isolation trench is formed to a depth of from about 4000 to about 8000 angstroms.

10. The method of claim 8 wherein the asymmetric trench is formed to a depth of from about 2000 to about 6000 angstroms.

11. The method of claim 8 wherein the capacitor node layer is formed to a thickness of from about 500 to about 2000 angstroms.

12. The method of claim 8 wherein the contiguous dielectric layer is formed to a thickness of from about 50 to about 200 angstroms.

13. The method of claim 8 wherein the contiguous conductor layer is formed to a thickness of from about 1500 to about 3500 angstroms.

14. The method of claim 8 further comprising ion implanting the sidewall of the active region within the asymmetric trench.

15. A method for forming a dynamic random access memory cell structure comprising:

providing a semiconductor substrate having formed therein an isolation trench adjoining a first active region of the semiconductor substrate separated from a second active region of the semiconductor substrate, the isolation trench having formed therein an isolation region;

forming within the isolation region an asymmetric trench which exposes a sidewall of the active region;

forming into the asymmetric trench a capacitor node layer which contacts the sidewall of the active region;

forming upon the first active region, the second active region and the capacitor node layer a contiguous dielectric layer which serves as a gate dielectric layer and a capacitor dielectric layer;

forming upon the contiguous dielectric layer a contiguous conductor layer which serves as a gate electrode and a capacitor plate layer;

patterning the contiguous conductor layer to form:
   a first gate electrode over the first active region of the semiconductor substrate and a second gate electrode over the second active region of the semiconductor substrate; and
   a capacitor plate layer over the capacitor node layer; and forming into the first active region a source/drain region electrically connected to the capacitor node layer.

16. The method of claim 15 wherein the isolation trench is formed to a depth of from about 4000 to about 8000 angstroms.

17. The method of claim 15 wherein the asymmetric trench is formed to a depth of from about 2000 to about 6000 angstroms.

18. The method of claim 15 wherein the capacitor node layer is formed to a thickness of from about 500 to about 2000 angstroms.

19. The method of claim 15 wherein the contiguous dielectric layer is formed to a thickness of from about 50 to about 200 angstroms.

20. The method of claim 15 wherein the contiguous conductor layer is formed to a thickness of from about 1500 to about 3500 angstroms.

* * * * *